US012609686B2

(12) United States Patent
Zhang et al.

(10) Patent No.: US 12,609,686 B2
(45) Date of Patent: Apr. 21, 2026

(54) DIGITALLY CONTROLLED DELAY LINE WITH TUNABLE RANGES

(71) Applicant: Apple Inc., Cupertino, CA (US)

(72) Inventors: Yudong Zhang, San Diego, CA (US); Hanan Cohen, San Diego, CA (US); Jacob S. Schneider, San Diego, CA (US); Sanjeev K. Maheshwari, Fremont, CA (US)

(73) Assignee: Apple Inc., Cupertino, CA (US)

( * ) Notice: Subject to any disclaimer, the term of this patent is extended or adjusted under 35 U.S.C. 154(b) by 15 days.

(21) Appl. No.: 18/662,957

(22) Filed: May 13, 2024

(65) Prior Publication Data

US 2025/0350270 A1      Nov. 13, 2025

(51) Int. Cl.
| *H03K 5/131* | (2014.01) |
| *H03K 5/133* | (2014.01) |
| *H03K 5/135* | (2006.01) |
| *H03K 5/00* | (2006.01) |

(52) U.S. Cl.
CPC ............. *H03K 5/131* (2013.01); *H03K 5/133* (2013.01); *H03K 5/135* (2013.01); *H03K 2005/00058* (2013.01)

(58) Field of Classification Search
CPC ........ H03K 5/131; H03K 5/133; H03K 5/135; H03K 2005/00058; H03K 5/134; H03K 5/14; H03K 5/15046; H03K 5/1504; H03K 5/15033; H03K 5/15026; H03K 5/1508; H03K 5/1502; H03K 5/15013
See application file for complete search history.

(56) References Cited

U.S. PATENT DOCUMENTS

| 5,594,376 | A | * | 1/1997 | McBride .................. H03K 5/13 |
| | | | | 327/146 |
| 7,816,963 | B1 | | 10/2010 | Cheung |
| 10,382,023 | B1 | | 8/2019 | Lu et al. |
| 10,439,601 | B2 | | 10/2019 | Ma |
| 10,447,280 | B2 | | 10/2019 | Mittal et al. |
| 10,727,842 | B2 | | 7/2020 | Behel et al. |
| 11,112,248 | B2 | | 9/2021 | Collin et al. |

FOREIGN PATENT DOCUMENTS

| CN | 102545887 | B | 11/2013 |
| DE | 10066110 | B4 | 7/2004 |
| JP | H07306912 | A | 11/1995 |
| KR | 698864 | B1 | 3/2007 |

* cited by examiner

*Primary Examiner* — Jung Kim
(74) *Attorney, Agent, or Firm* — DICKINSON WRIGHT RLLP

(57)      ABSTRACT

A delay-line circuit that includes both fixed-delay line circuit and a variable delay-line circuit is disclosed. The fixed delay-line circuit may generate a first output clock signal by delaying an input clock signal by a particular delay period. The variable delay-line circuit may include multiple fixed-delay circuits and variable-delay circuits, and may select a particular subset of the fixed-delay circuits and the variable delay circuits based on a frequency of the input clock signal. The particular subset of the fixed-delay and variable-delay circuits may generate a second output clock signal by delaying the input clock signal by another delay period different than the particular delay period.

18 Claims, 11 Drawing Sheets

Fixed Delay
Line Circuit
101

Input
Signal
205    201         202         203    Output
Signal
206

*Input Signal 503*

*Output Signal 504*

*Adjustment Signals 505*

DIGITALLY CONTROLLED DELAY LINE WITH TUNABLE RANGES

FIELD

The described embodiments relate generally to computer systems and, more particularly, to techniques for generating delayed versions of signals.

BACKGROUND

Modern computer systems may include multiple circuit blocks designed to perform various functions. For example, such circuit blocks may include processors or processor cores configured to execute software or program instructions. Additionally, the circuit blocks may include memory circuits, mixed-signal circuits, analog circuits, and the like.

Some computer systems include circuit blocks that include digital circuits that operate using a period digital signal referred to as a "clock signal." Various circuits may be used to generate clock signals in a computer system. For example, in some computer systems, a crystal oscillator circuit or an inductor-capacitor oscillator circuit (referred to as an "LC oscillator circuit") may be used to generate a clock signal that has a particular frequency. Clocks signals of other frequencies can be generated using phase-locked loop circuits or delay-locked loop circuits.

BRIEF DESCRIPTION OF THE DRAWINGS

FIG. 2 is a block diagram depicting an embodiment of a fixed delay-line circuit.

DETAILED DESCRIPTION

Figure 1:
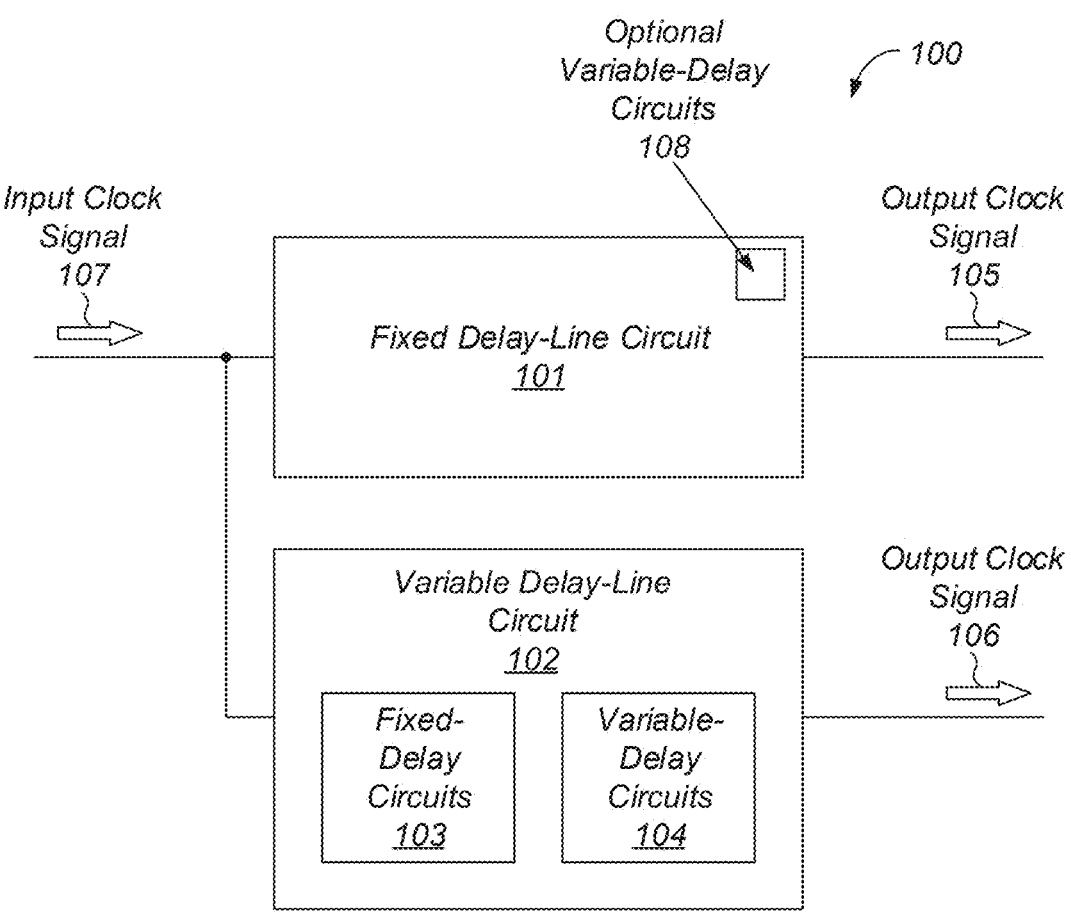
FIG. 1 is a block diagram depicting an embodiment of a digitally controlled delay line that includes a fixed-delay line and a variable-delay line.

Computer systems may include multiple circuit blocks configured to use periodic signals, referred to as clock signals, to perform various operations. For example, in some computer systems one or more clock signals may be used to send data from one device to another within the computer system. In such cases, the one or more clock signals may be transmitted along with the data, and the receiving device may use the one or more clock signals to sample the received data.

A variety of techniques may be employed to generate the various clock signals a computer system may employ. In some cases, a crystal oscillator circuit or LC oscillator circuit may be used to generate a base clock signal that can be used to generate other clock signals of various frequencies. In some computer systems, phase-locked loop circuits or delay-locked loop circuits may be employed to generate the desired clock signals.

Another technique for generating clock signals involves the use of a digitally controlled delay line ("DCDL") circuit that generates different clocks signals with the same frequency but different phases by delaying an input clock signal by different time periods. For example, a DCDL may be used to generate quadrature clock signals where the phase difference between each of the quadrature clock signals is 90-degrees. In some computer system, quadrature clock signals can be transmitted along with data from one device to another within the computer system. The receiving device can include a phase interpolator circuit that uses the phase difference between the quadrature clock signals to determine when to sample the received data.

Many DCDL circuits include both a fixed-delay path and a variable-delay path that generate respective clock signals by delaying an input clock signal. The delay of the variable-delay path can be adjusted to compensate for changes in the operating conditions of a computer system. For example, a change in temperature or power supply voltage can affect the delay of both the fixed-delay path and the variable-delay path. Control circuits can adjust the delay of the variable-delay path to maintain the desired phase difference between the generated clock signals.

In some computer systems, DCDL circuits are used in applications where the input clock signal may have multiple values depending on the application or operating mode of a communication bus. In such cases, the variable-delay path must be tunable over the entire range of the allowed input frequencies. To allow sufficient tunable range for the variation associated with the entire range of allowed input frequencies, complex circuits are employed which can result in undesirable circuit area and power consumption.

The embodiments illustrated in the drawings and described below provide techniques for using different subsets of fixed-delay circuits and variable-delay circuits to implement a variable-delay line circuit. Different subsets are used based on a frequency of an input clock signal which can be a function of the application or performance setting associated with the application. Since the subsets are used for different input frequencies, they can be tuned separately for the variation associated with the different input frequencies. By tuning the different subsets separately, the overall complexity of the delay-line circuit can be reduced, which can result in both area and power savings.

A block diagram of a delay-line circuit is depicted in FIG. 1. As illustrated, delay-line circuit 100 includes fixed delay-line circuit 101 and variable delay-line circuit 102. Although delay-line circuit 100 is depicted as having a single fixed delay-line circuit and a single variable delay-line circuit, in other embodiments, delay-line circuit 100 can include any suitable number of fixed and variable delay-line circuits.

Fixed delay-line circuit 101 is configured, in response to a given transition on input clock signal 107, to generate a corresponding transition on output clock signal 105 after a particular delay period has elapsed. As described below, the particular delay period may be based on a number of gate delays included in fixed delay-line circuit 100. In some embodiments, a value for the particular delay period may be based on a communication standard for the transmission of data between two devices included in a computer system.

In some applications, the delay between input clock signal 107 and output clock signal 105 is equally important to the delay between input clock signal 107 and output clock signal 106. In such cases, fixed delay-line circuit 101 may optionally include variable-delay circuits 108 to increase the tuning range of fixed delay-line circuit 101. In cases when the delay between input clock signal 107 and output clock signal 105 is more important than the delay between input clock signal 107 and output clock signal 106, variable-delay circuits 108 may be omitted Variable delay-line circuit 102 includes fixed-delay circuits 103 and variable-delay circuits 104. In various embodiments, variable delay-line circuit 102 is configured to select, based on a frequency of input clock signal 107, a particular subset of fixed-delay circuits 103 and variable-delay circuits 104. Variable delay-line circuit 102 is further configured, in response to the particular subset receiving the given transition of input clock signal 107, to generate a corresponding transition on output clock signal 106 after a different delay period has elapsed. In various embodiments, the different delay period is greater than the particular delay period.

As described below, respective amounts of delay generated by variable-delay circuits 104 may be adjusted based on one or more operating conditions of a computer system that includes delay-line circuit 100. For example, in some cases, the delay generated by one or more of variable-delay circuits 104 may be adjusted based on a voltage level of a power supply node coupled to delay-line circuit 100 or the temperature of delay-line circuit 100. Additionally, or alternatively, the delay generated by one or more of variable-delay circuits 104 may be adjusted based on electrical properties of the transistors, e.g., threshold voltage values, resulting from the manufacture of delay-line circuit 100.

Figure 2:
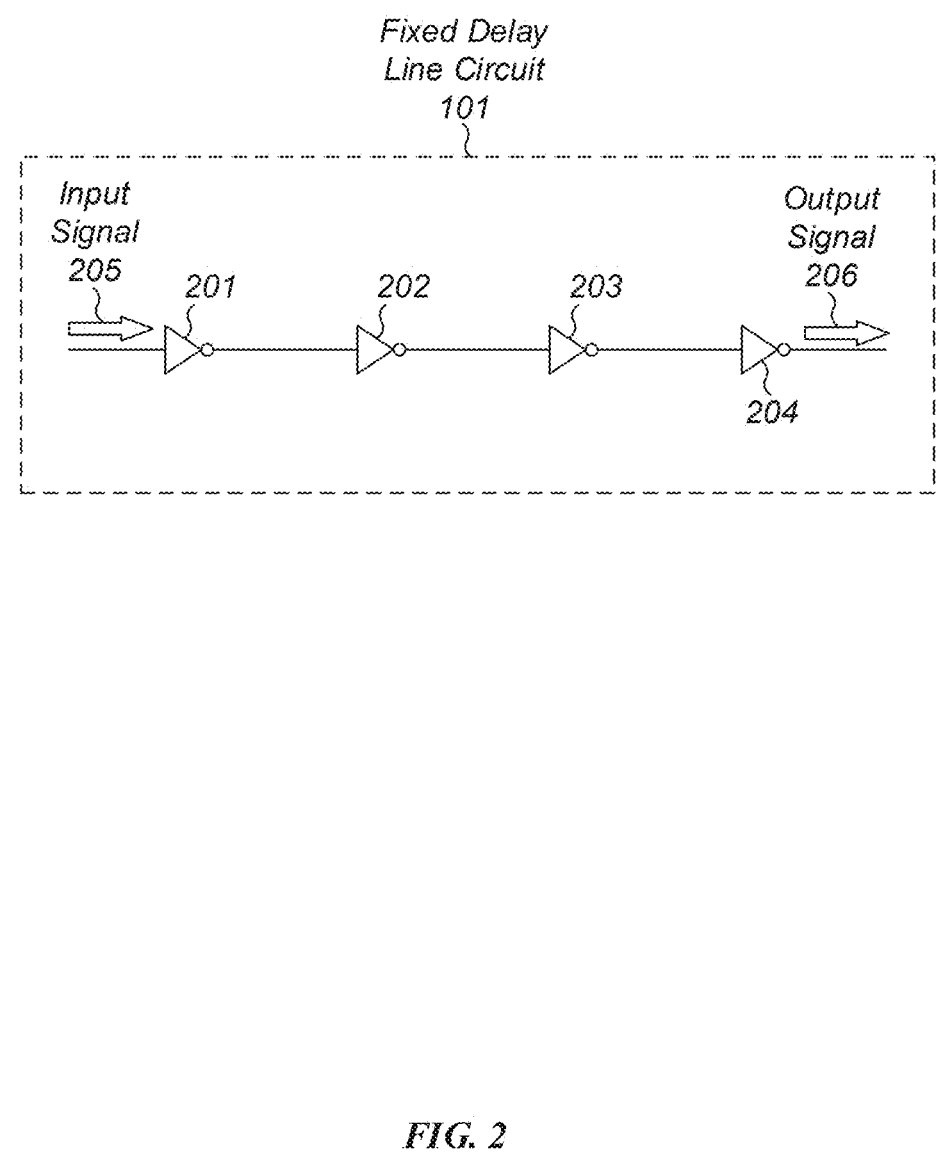

Turning to FIG. 2, a block diagram of an embodiment of fixed delay-line circuit 101 is depicted. As illustrated, fixed delay-line circuit 101 includes inverters 201-204. Although only four inverters are depicted in the embodiment of FIG. 2, in other embodiments, any suitable number of inverters may be employed.

Inverters 201-204 are coupled together in series with an output of inverter 201 coupled to an input of inverter 202, as so on. An input of inverter 201 is coupled to a circuit node through which input signal 205 propagates, and an output of inverter 204 is coupled to a circuit node through which output signal 206 propagates. In various embodiments, input signal 205 may correspond to input clock signal 107, and output signal 206 may correspond to output clock signal 105.

When the logical value of input signal 205 changes, i.e., transitions from a low-logic level to a high-logic level, or vice versa, the change sequentially propagates through inverters 201-204. Each of inverters 201-204 take a corresponding period of time, referred to as a "gate delay", to change their respective output values in response to a change in the respective input values. In the present embodiment, a change in the value of input signal 205 results in a change in the value of output signal 206 after each of inverters 201-204 have changed their respective output values, i.e., four gate delays after the change in input signal 205. In other words, fixed delay-line circuit 101 generates output signal 206 by delaying input signal 205 by four gate delays. It is noted that the amount of delay between input signal 205 and output signal 206 can be changed by increasing or decreasing the number of inverters.

In some embodiments, the respective gate delays of inverters 201-204 may be the same. In other embodiments, different ones of inverters 201-204 may have different gate delays. The gate delay of a given inverter of inverters 201-204 may be adjusted by changing the electrical characteristics of transistors included in the given inverter, or by changing the load of the given transistor through the addition or subtraction of capacitors, dummy transistors, or the like.

In other embodiments, the delay of fixed-delay line 101 may be modified by changing the fanout of one or more of inverters 201-204. By increasing the fanout of different ones of inverters 201-204, the delay between input signal 205 and output signal 206 can be increased. To increase the fanout of a given inverter of inverters 201-204, the size of the inverter coupled to the output of the given inverter can be increased. In a similar fashion, the respective fanouts of inverters 201-204 can be decreased in order to reduce the delay between input signal 205 and output signal 206.

In various embodiments, inverters 201-204 may be implemented as complementary metal-oxide semiconductor ("CMOS") inverters that include at least one n-channel metal-oxide semiconductor field-effect transistor ("MOSFET") and at least one p-channel MOSFET. It is noted that, in other embodiments, technologies other than CMOS may be employed to implement any suitable inverting or non-inverting amplifier circuits for use as inverters 201-204.

Figure 3:
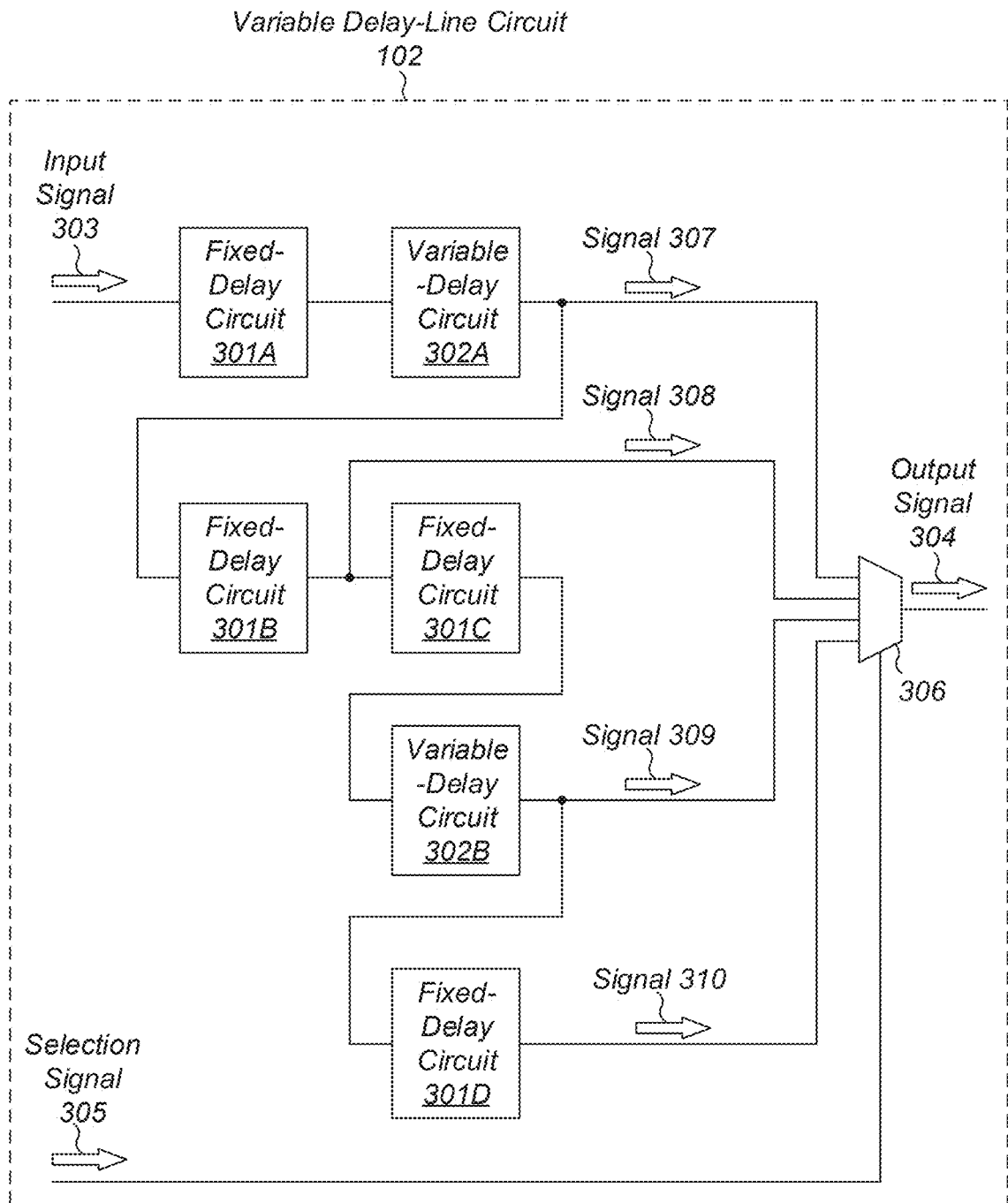
FIG. 3 is a block diagram depicting an embodiment of a variable delay-line circuit.

A block diagram of an embodiment of variable delay-line circuit 102 is depicted in FIG. 3. As illustrated, variable delay-line circuit 102 includes fixed-delay circuits 301A-301D, variable-delay circuits 302A-302B, and multiplex circuit 306. In various embodiments, input signal 303 may correspond to input clock signal 107, output signal 304 may correspond to output clock signal 106, fixed-delay circuits 301A-301D may be included in fixed-delay circuits 103, and variable-delay circuits 302A-302B may be included in variable-delay circuits 104.

A first subset of the delay cells included in variable delay-line circuit 102 includes fixed-delay circuit 301A and variable-delay circuit 302A coupled together in series. In various embodiments, the first subset is configured to generate signal 307 by delaying input signal 303. In some embodiments, the total delay of the first subset is determined based on a frequency of input signal 303.

A second subset of the delay cells included in variable delay-line circuit 102 includes the first subset coupled in series with fixed-delay circuit 301B. In various embodiments, the second subset is configured to generate signal 308 by delaying input signal 303. Since the second subset includes the first subset, signal 308 can also be understood as a delayed version of signal 307, where an amount of delay between signal 307 and signal 308 corresponds to an amount of delay generated by fixed-delay circuit 301B.

A third subset of the delay cells included in variable delay-line circuit 102 includes the second subset coupled, in series, with fixed-delay circuit 301C and variable-delay circuit 302B. In various embodiments, the third subset is configured to generate signal 309 by delaying input signal 303. Since the third subset includes the second subset, signal 309 can also be understood as a delayed version of signal 308, where an amount of delay between signal 308 and signal 309 corresponds to an amount of delay generated by fixed-delay circuit 301C and variable-delay circuit 302B.

A fourth subset of the delay cells included in variable delay-line circuit 102 includes the third subset coupled, in series, with fixed-delay circuit 301D. In various embodiments, the fourth subset is configured to generate signal 310 by delaying input signal 303. Since the fourth subset includes the third subset, signal 310 may also be understood as a delayed version of signal 309, where an amount of delay between signal 309 and signal 310 corresponds to an amount of delay generated by fixed-delay circuit 301D.

Multiplex circuit 306 is configured to select one of signals 307-310 to generate output signal 304. In various embodiments, multiplex circuit 306 is configured to select the output of the different subsets based on selection signal 305. Although selection signal 305 is depicted as a single wire, in other embodiments, any suitable number of wires may be used to encode selection signal 305.

In various embodiments, multiplex circuit 306 may be implemented using multiple logic gates, multiple pass gates arranged in a wired-OR fashion, or any other suitable combination of logic gates and/or MOSFETs.

It is noted that the different subsets of the delay cells included in variable delay-line circuit 102 are merely examples. In other embodiments, different numbers of subsets may be employed, and/or the composition of the subsets may be different.

In some embodiments, tuning may only be needed in certain delay ranges generated by variable delay-line circuit 102. In such cases, variable-delay circuits included in variable delay-line circuit 102 can be included in a single subset of the delay circuits.

Figure 4:
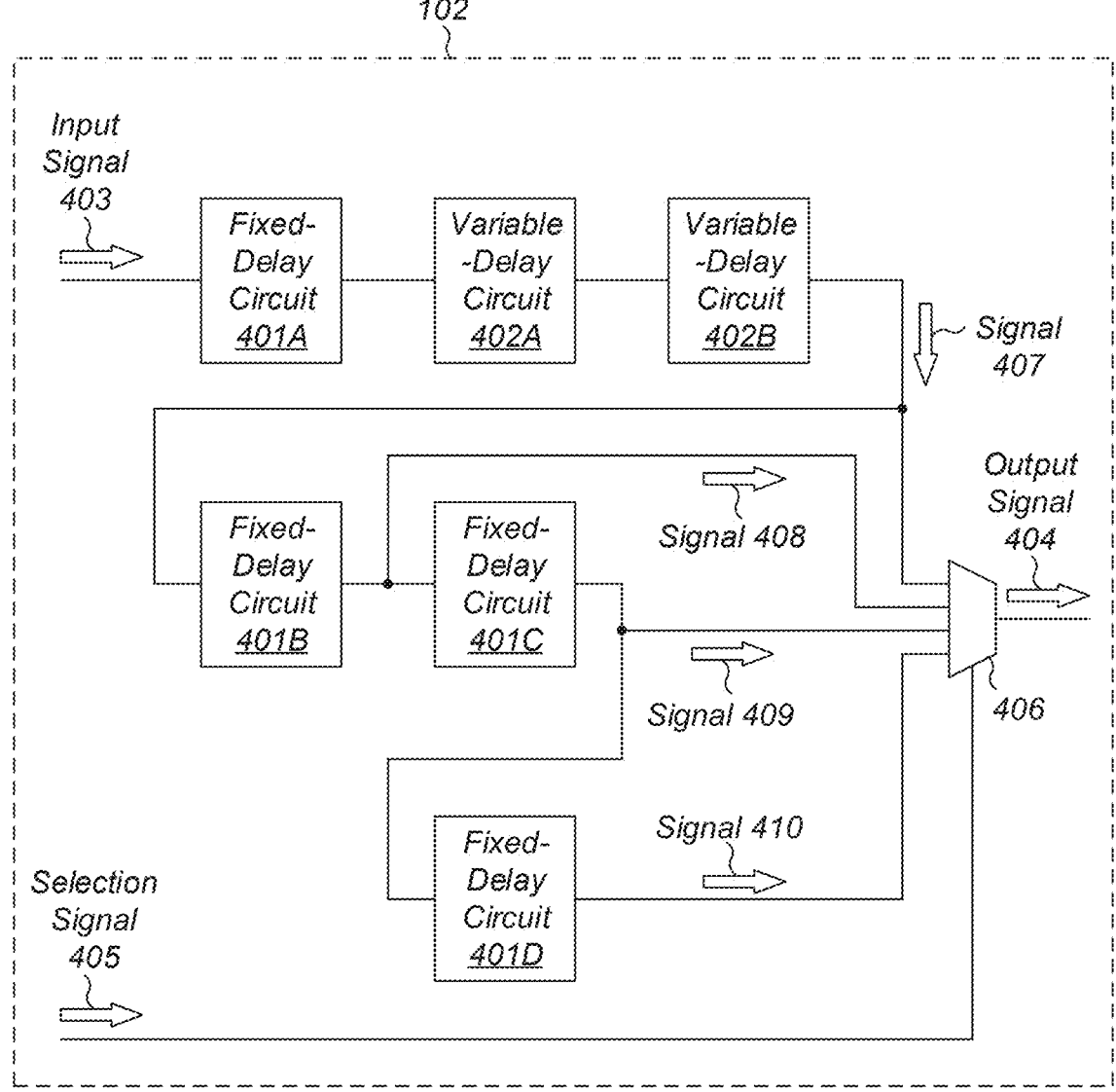
FIG. 4 is a block diagram depicting a different embodiment of a variable delay-line circuit.

Turning to FIG. 4, a block diagram of a different embodiment of variable delay-line 102 is depicted. As illustrated, variable delay-line circuit 102 includes fixed-delay circuits 401A-401D, variable-delay circuits 402A-402B, and multiplex circuit 406. In various embodiments, input signal 403 may correspond to input clock signal 107, output signal 404 may correspond to output clock signal 106, fixed-delay circuits 401A-401D may be included in fixed-delay circuits 103, and variable-delay circuits 402A-402B may be included in variable-delay circuits 104.

A first subset of the delay cells included in variable delay-line circuit 102 includes fixed-delay circuit 401A and variable-delay circuits 402A-402B coupled together in series. In various embodiments, the first subset is configured to generate signal 407 by delaying input signal 403. In some embodiments, the total delay of the first subset is determined based on a frequency of input signal 403. It is noted that although variable-delay circuits 402A-402B are included in the first subset of the delay cells, in other embodiments, variable-delay circuits 402A-402B may be included in other subsets of the delay cells included in variable delay-line circuit 102.

A second subset of the delay cells included in variable delay-line circuit 102 includes the first subset coupled in series with fixed-delay circuit 401B. In various embodiments, the second subset is configured to generate signal 408 by delaying input signal 403. Since the second subset includes the first subset, signal 408 can also be understood as a delayed version of signal 407, where an amount of delay between signal 407 and signal 408 corresponds to an amount of delay generated by fixed-delay circuit 401B.

A third subset of the delay cells included in variable delay-line circuit 102 includes the second subset coupled, in series, with fixed-delay circuit 401C. In various embodiments, the third subset is configured to generate signal 409 by delaying input signal 403. Since the third subset includes the second subset, signal 409 can also be understood as a delayed version of signal 408, where an amount of delay between signal 408 and signal 409 corresponds to an amount of delay generated by fixed-delay circuit 401C.

A fourth subset of the delay cells included in variable delay-line circuit 102 includes the third subset coupled, in series, with fixed-delay circuit 401D. In various embodiments, the fourth subset is configured to generate signal 410 by delaying input signal 403. Since the fourth subset includes the third subset, signal 410 may also be understood as a delayed version of signal 409, where an amount of delay between signal 409 and signal 410 corresponds to an amount of delay generated by fixed-delay circuit 401D.

Multiplex circuit 406 is configured to select one of signals 407-410 to generate output signal 404. In various embodiments, multiplex circuit 406 is configured to select the output of the different subsets based on selection signal 405. Although selection signal 405 is depicted as a single wire, in other embodiments, any suitable number of wires may be used to encode selection signal 405.

In various embodiments, multiplex circuit 306 may be implemented using multiple logic gates, multiple pass gates arranged in a wired-OR fashion, or any other suitable combination of logic gates and/or MOSFETs.

Figure 5A:
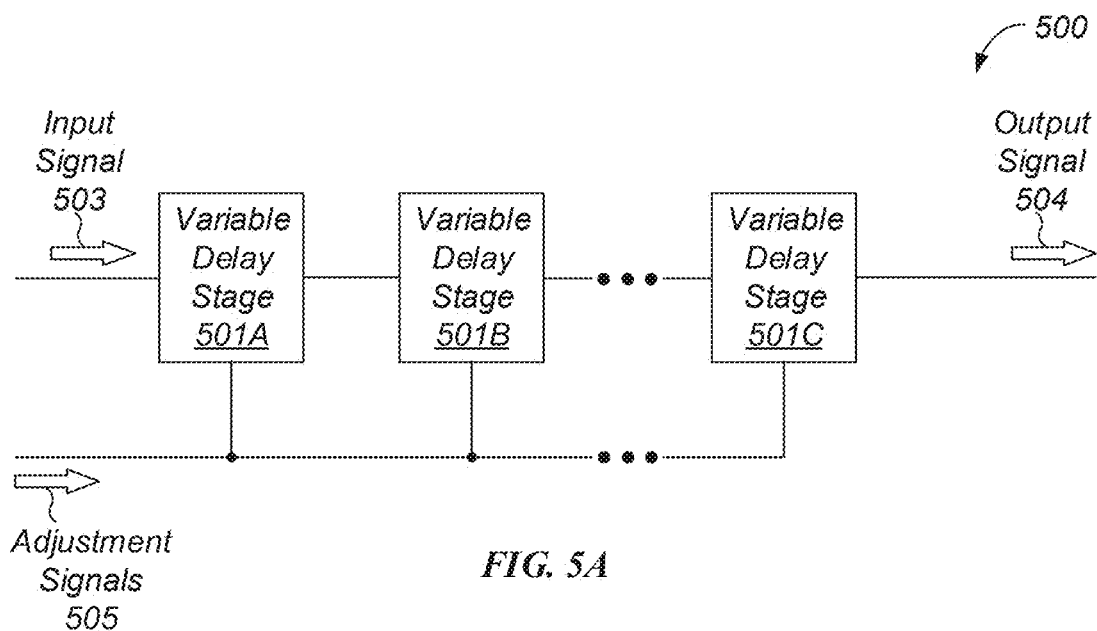
FIG. 5A is a block diagram depicting an embodiment of a variable-delay circuit.

Turning to FIG. 5A, a block diagram of an embodiment of a variable-delay circuit is depicted. As illustrated, variable-delay circuit 500 includes variable-delay stages 501A-501C. In various embodiments, variable-delay circuit 500 may correspond to any of variable-delay circuits 302A302B as depicted in FIG. 3, or variable-delay circuits 402A-402B as depicted in FIG. 4.

Variable-delay stages 501A-501C are coupled together in series to generate a delayed version of input signal 503. Although only three stages are show in the embodiment of FIG. 5A, in other embodiments, any suitable number of variable-delay stages may be employed in order to generate a desired amount of delay between input signal 503 and output signal 504.

Variable-delay stages 501A-501C are further configured to adjust an amount of delay between their respective input signals and their respective output signals based on adjustment signals 505. In various embodiments, variable-delay stages 501A-501C can be adjusted together or individually.

Figure 5B:
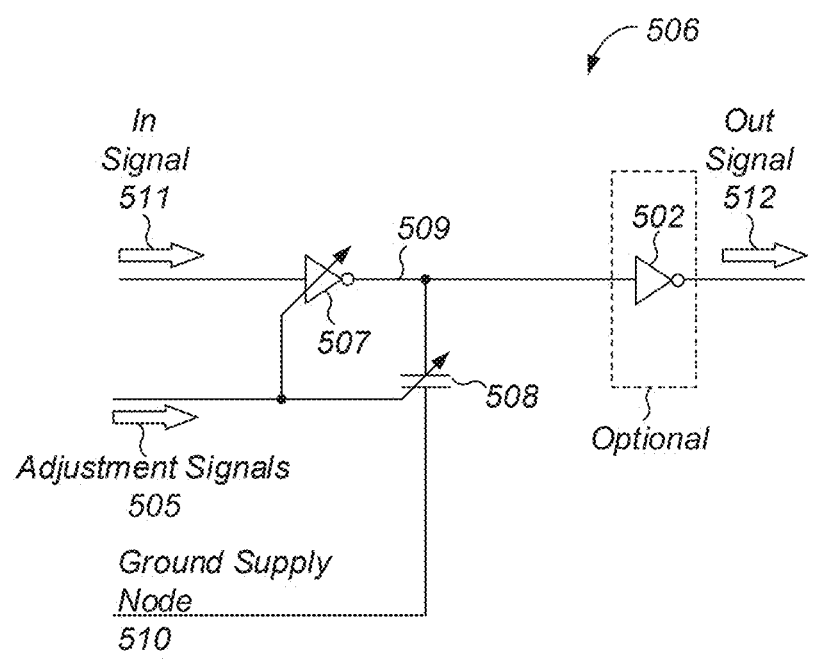
FIG. 5B is a block diagram depicting an embodiment of a variable-delay stage used in a variable-delay circuit.

Turning to FIG. 5B, a block diagram of a variable-delay stage is depicted. As illustrated, variable-delay stage 506 includes variable inverter 507, variable capacitor 508, and optional inverter 502. In various embodiments, variable-delay stage 506 may correspond to any of variable-delay stages 501A-501C.

Inverter 507 is configured to receive signal 511 and generate signal 512 on node 509 using signal 511. Variable capacitor 508 is coupled between node 509 and ground supply node 510.

When signal 511 transitions, variable inverter 507 sinks or sources current to node 509, causing the voltage of node 509 to decrease or increase, respectively. An amount of time from when signal 511 transitions to the corresponding transition on signal 512 is based on the rise/fall time of node 509. Variable inverter 507 is configured to adjust an amount of current that it sinks or sources to node 509 based on adjustment signals 505. When the amount of current that variable inverter 507 can sink or source to node 509 increases, the rise/fall time of node 509 decreases, thereby reducing the time period from when signal 511 transitions to the corresponding transition of signal 512. In a similar fashion, when the amount of current that variable inverter 507 sinks or sources to node 509 decreases, the rise/fall time of node 509 increases, thereby increasing the time period from when signal 511 transitions to the corresponding transition of signal 512.

In addition to changing the amount of current that inverter 507 can sink or source to node 509, variable capacitor 508 can be used to increase or decrease the amount of capacitance coupled to node 509 based on adjustment signals 505. When the value of variable capacitor 508 is increased, the rise/fall time of node 509 increases, thereby increasing the time period from when signal 511 transitions to the corresponding transition of signal 512. When the value of variable capacitor 508 is decreased, the rise/fall time of node 509 decreases, thereby reducing the time period from when signal 511 transitions to the corresponding transition of signal 512.

In various embodiments, adjustment signals 505 may be a digital signal that includes multiple bits. In some cases, a subset of the bits may be used to control variable inverter 507, and a different subset of the bits may be used to control variable capacitor 508. It is noted that variable inverter 507 and variable capacitor 508 can be adjusted individually or together.

In some embodiments, optional inverter 502 is included at the end of the chain of variable-delay stages. Optional inverter 502 may be included to provide additional drive capability. Alternatively, or additionally, optional inverter 502 may be included to improve the slope of the output of variable-delay stage 506.

In various embodiments, variable inverter 507 may be implemented with multiple p-channel MOSFETs in parallel and multiple n-channel MOSFETs in parallel. Different numbers of the p-channel MOSFETs and the n-channel MOSFETs may be coupled to node 509 based on adjustment signals 505 in order to adjust an amount of current that variable inverter 507 can source to or sink from node 509. In various embodiments, variable inverter 507 may be implemented using technologies other than CMOS.

Variable capacitor 508 may include multiple capacitors and switches that couple different ones of the multiple capacitors between node 509 and ground supply node 510 based on adjustment signals 505. In various embodiments, the multiple capacitors may be implemented using metal-oxide-metal ("MOM") capacitor structures, metal-insulator-metal ("MIM") structures, or any other suitable capacitor structure available on a semiconductor manufacturing process.

It is noted that the embodiment depicted in FIG. 5B is merely an example. In other embodiments, different circuit techniques, e.g., variable power supply voltages, may be employed to adjust the delay of a signal propagating through variable-delay stage 506.

Figure 6:
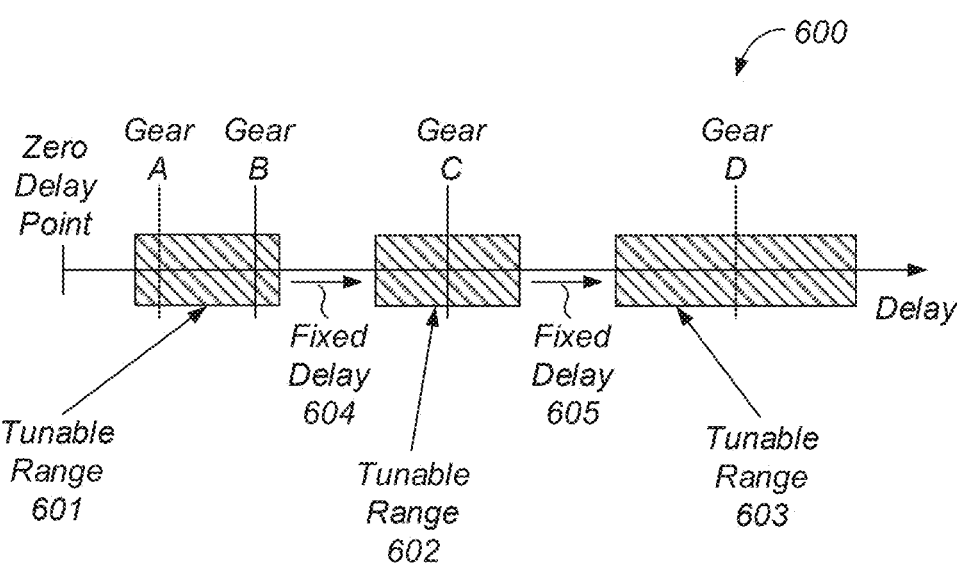
FIG. 6 is a diagram depicting different adjustable ranges of a variable delay-line circuit.

Turning to FIG. 6, a graph depicting different adjustable ranges of a variable delay-line circuit is depicted. As illustrated, graph 600 shows tunable ranges 601-603 associated with the different target gears. As used herein, a gear refers to one or more input frequency values associated with different applications.

By grouping some input frequencies together, e.g., the input frequencies associated with Gears A and B, a single subset of the delay cells included in variable delay-line circuit 102 can be employed to generate the desired delay while still keeping tunable range 601 small to reduce circuit complexity, area, and power consumption. It is noted that which gears can be grouped together depends on a range of the frequencies associated with the gears, and the groups (or subsets) may be selected to minimize a number of variable-delay circuits that need to be employed.

As depicted above in regard to FIG. 3, between some of the tunable ranges a fixed-delay circuit is added. For example, between tunable range 601 and tunable range 602, fixed delay 604 is inserted. In a similar fashion, fixed delay 605 is inserted between tunable range 602 and tunable range 603. As previously noted, the fixed delays, which may correspond to one or more fixed-delay circuits or cells, are inserted in positions to minimize a number of variable delay cells, leading to area and power consumption savings.

Although three gears are depicted in the embodiment of FIG. 6, in other embodiments, variable delay-line circuit 102 can be designed to support any desired number of gears. In such cases, different groupings (or subsets) with different respective delays may be employed.

Figure 7:
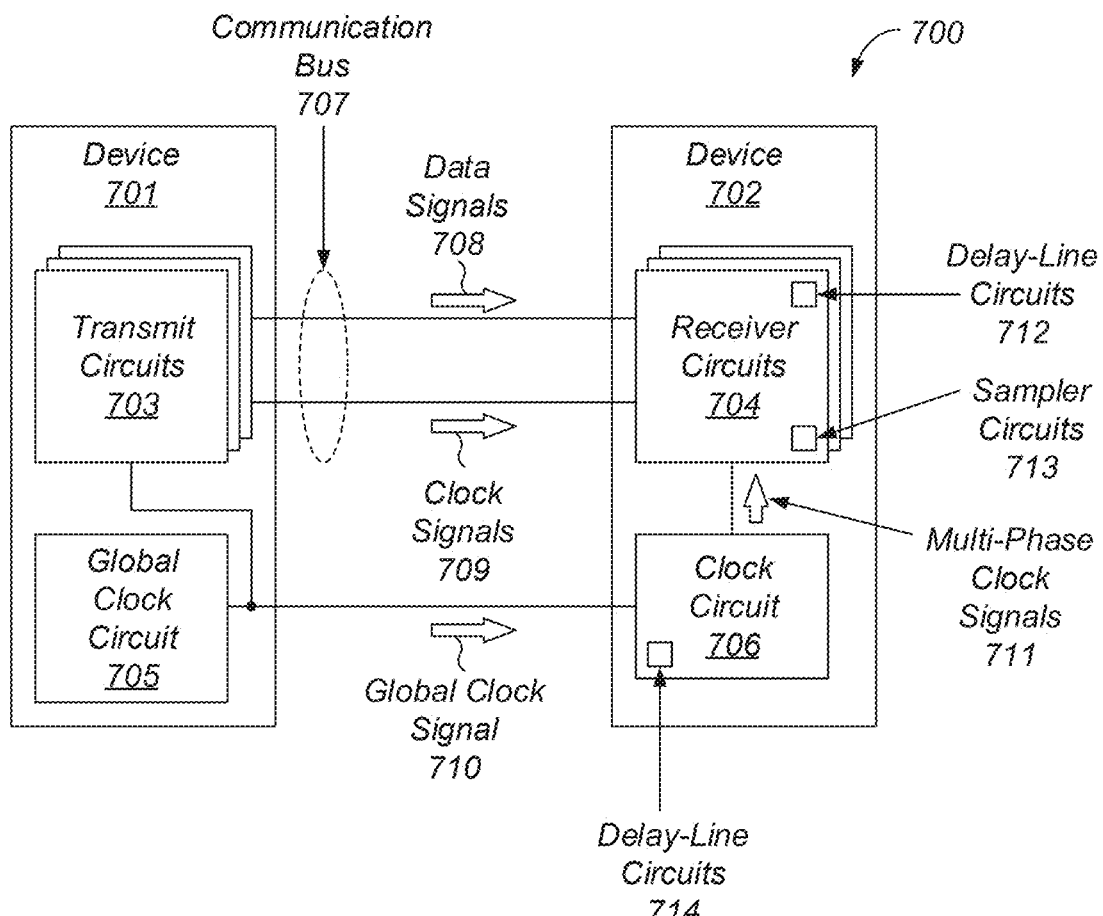
FIG. 7 is a block diagram depicting an embodiment of a computer system that transmits data between two devices.

Turning to FIG. 7, a block diagram of a computer system is depicted. As illustrated, computer system 700 includes device 701 and device 702 that are coupled together via communication bus 707. In various embodiments, communication bus 707 may employ one of various communication protocols such as Peripheral Component Interface ("PCI"), or any other suitable communication protocol.

Device 701 includes transmit circuits 703 and global clock circuit 705. Transmit circuits 704 are configured to transmit data signals 708 and clock signals 709 over corresponding lanes included in communication bus 707. In some embodiments, transmit circuit 704 may be configured to generate clock signals 709 using global clock signal 710. Although three transmit circuits are depicted in the embodiment of FIG. 7, in other embodiments, device 701 may employ any suitable number of transmit circuits.

Global clock circuit 705 which is configured to generate global clock signal 710. Global clock circuit 705 may be further configured to transmit global clock signal 710 to transmit circuits 704 and, optionally, to device 702. In various embodiments, global clock circuit 705 may be implemented using crystal oscillator circuits, phase-locked loop circuits, delay-locked loop circuits, digitally controlled delay-line circuits, or any other circuit suitable for clock signal generation.

Device 702 includes receiver circuits 704 and clock circuit 706. Receiver circuits 704 are configured to receive data signal 708 and clock signals 709. In various embodiments, receiver circuits 704 are further configured to process data signals 708 and clock signals 709 to extract data encoded in data signals 708. To process data signals 708, receiver circuits may be configured to amplify and/or filter data signals 708, and sample the resultant signal using sampler circuit 713. In various embodiments sampler circuits 713 may include both data sampler circuits and edge sampler circuits, and may operate using multi-phase clock signals 711. Although three receiver circuits are depicted in the embodiment of FIG. 7, in other embodiments, device 702 may employ any suitable number of receiver circuits.

Receiver circuits 704 include delay-line circuits 712. In some embodiments, each of receiver circuits 704 may include at least one of delay-line circuits 712 which may correspond to delay-line circuit 100 as depicted in FIG. 1. Receiver circuits 704 may be configured to generate, using delay-line circuits 712 and multi-phase clock signals 711, local clock signals used to perform clock-data recovery.

Clock circuit 706 includes delay-line circuits 714 and is configured to generate multi-phase clock signals 711 using global clock signal 710. In various embodiments, any of delay-line circuit 714 may correspond delay-line circuit 100 as depicted in FIG. 1. In some cases, multi-phase clock signals 711 may be quadrature clock signals.

It is noted that both device 701 and device 702 may include numerous other circuit blocks which have been omitted from FIG. 7 for clarity. For example, in various embodiments, both device 701 and device 702 may include memory circuits, processor circuits, input/output circuits, and the like.

To summarize, various embodiments of a delay-line circuit are disclosed. Broadly speaking, a delay-line circuit may include a fixed delay-line circuit and a variable delay-line circuit. The fixed delay-line circuit may be configured, in response to a given transition of an input clock signal, to generate a corresponding transition on a first output phase clock after a particular delay period has elapsed. The variable delay-line circuit may include a plurality of fixed-delay circuits and a plurality of variable-delay circuits. The variable delay-line circuit may be configured to select, based on a frequency of the input clock signal, a particular subset of the plurality of fixed-delay circuits and the plurality of variable-delay circuits. The variable-delay line circuit may be further configured to generate, in response to the particular subset receiving the given transition, a second corresponding transition on a second output phase clock after a different delay period has elapsed.

Figure 8:
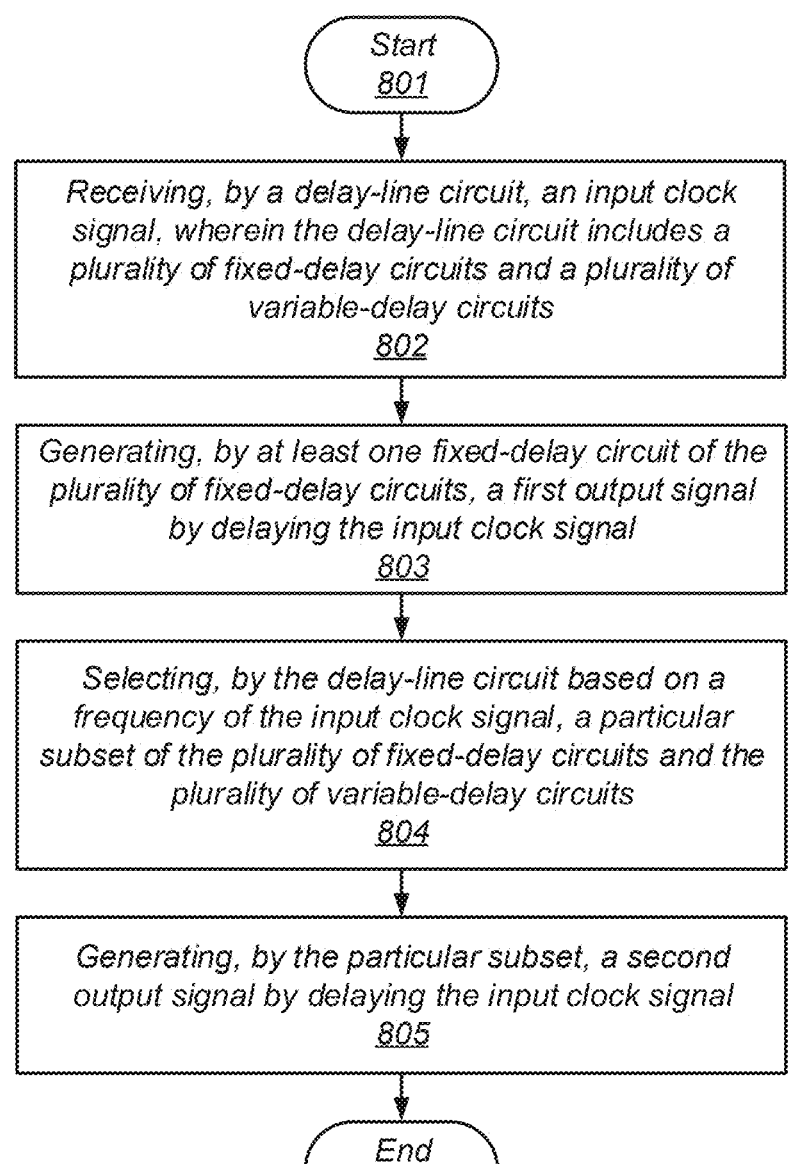
FIG. 8 is a flow diagram depicting an embodiment of a method for operating a variable-delay line circuit.

Turning to FIG. 8, a flow diagram depicting an embodiment of a method for operating a delay-line circuit is illustrated. The method, which may be applied to various delay-line circuits, e.g., delay-line circuit 100 as depicted in FIG. 1, begins in block 801.

The method include receiving, by a delay-line circuit, an input clock signal (block 802). In various embodiments, the delay-line circuit includes a plurality of fixed-delay circuit and a plurality of variable-delay circuits. In some embodiments, the method may include, in response to a given transition of a first signal being received by a particular variable-delay circuit of the plurality of variable delay circuits, generating a corresponding transition on a second signal after a particular delay period has elapsed. In various embodiments, the particular delay period is based on at least one operating condition, e.g., power supply voltage, electrical characteristics of the transistors used to implement the delay-line circuit as determined during manufacture, temperature, and the like. In some cases, a digital signal including one or more bits may encode information used by the particular variable-delay circuit to adjust its corresponding gate delay.

The method also includes generating, by at least one fixed-delay circuit of the plurality of fixed-delay circuits, a first output signal by delaying the input clock signal (block 803). In some embodiments, generating the first output signal includes delaying the input clock signal by a first delay period.

The method further includes selecting, by the delay-line circuit based on a frequency of the input clock signal, a particular subset of the plurality of fixed-delay circuits and the plurality of variable-delay circuits (block 804). In various embodiments, selecting the particular subset may be performed at the time of manufacture. In other cases, selecting the particular subset may be performed at any suitable time. For example, the particular subset may be selected for a particular mode of operation of a computer system, and a different subset may be selected for a different mode of operation of the computer system.

In some embodiments, selecting the particular subset includes selecting, in response to determining that the input clock signal has a first frequency, a first subset of the plurality of fixed-delay circuits and the plurality of variable-delay circuits. In such cases, the first subset can include a first fixed-delay circuit of the plurality of fixed-delay circuits coupled, in series, with a first variable-delay circuit of the plurality of variable-delay circuits.

In other embodiments, the method may further include selecting, in response to determining that the input clock signal has a second frequency less than the first frequency, a second subset of the plurality of fixed-delay circuits and the plurality of variable-delay circuits. In such cases, the second subset can include the first subset coupled, in series, with a second fixed-delay circuit of the plurality of fixed-delay circuits.

In some embodiments, the method may further include selecting, in response to determining that the input clock signal has a third frequency less than the second frequency, a third subset of the plurality of fixed-delay circuits and the plurality of variable-delay circuits. In such cases, the third subset can include the second subset coupled, in series, with a third fixed-delay circuit of the plurality of fixed-delay circuits and a second variable-delay circuit of the plurality of fixed-delay circuits.

In other embodiments, the method may include selecting, in response to determining that the input clock signal has a fourth frequency less than the third frequency, a fourth subset of the plurality of fixed-delay circuits and the plurality of variable-delay circuits. In such cases, the fourth subset can include the third subset coupled, in series, with a fourth fixed-delay circuit of the plurality of fixed-delay circuits.

The method also includes generating, by the particular subset, a second output signal by delaying the input clock signal (block 805). In various embodiments, generating the second output signal includes delaying the input clock signal by a second delay period different from the first delay period. In some embodiments, the different between the first delay period and the second delay period corresponds to a 90-degree phase shift between the first output signal and the second output signal. The method concludes in block 806.

Figure 9:
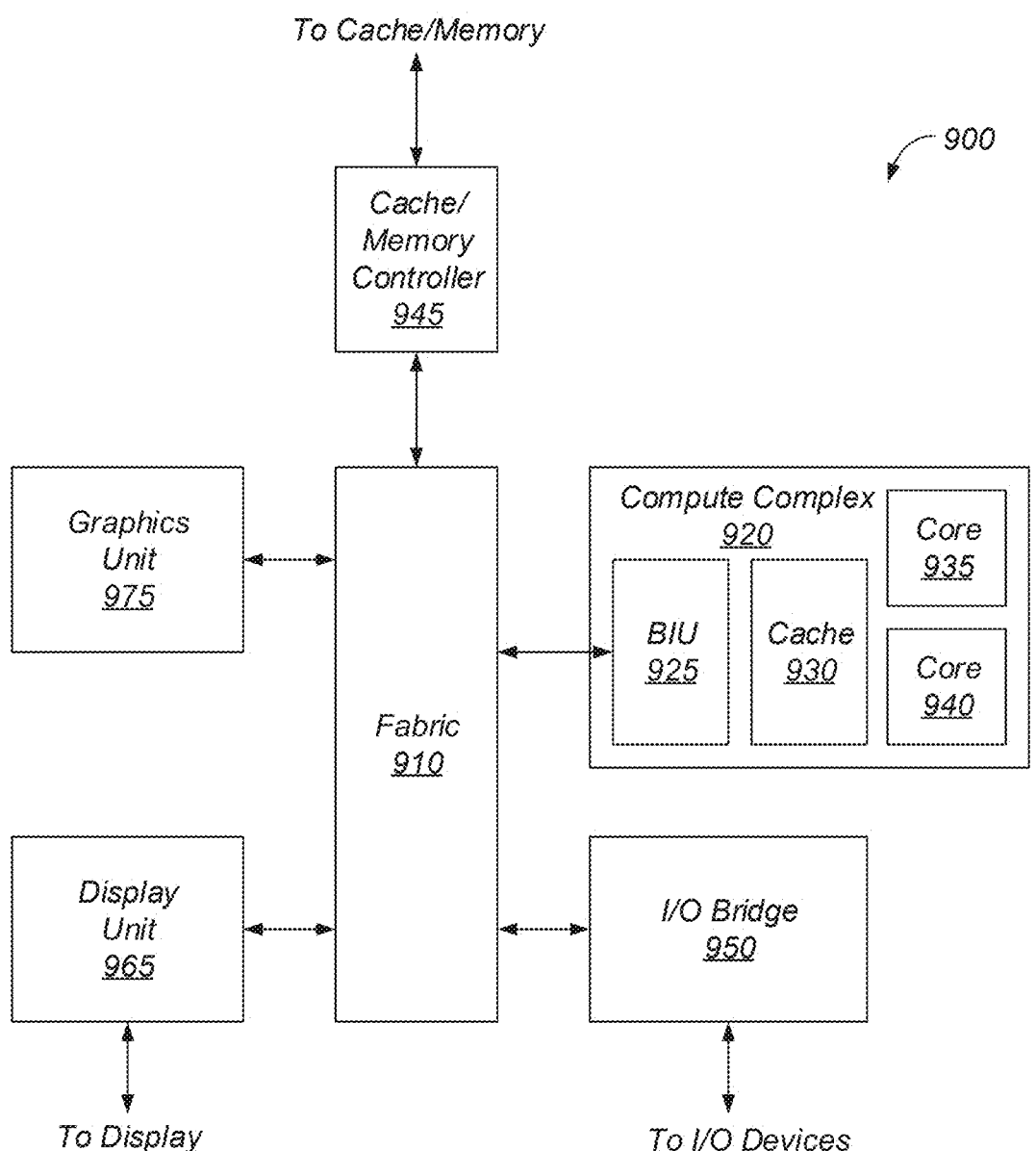
FIG. 9 is a block diagram of an embodiment of a device that includes aggregator circuits.

Referring now to FIG. 9, a block diagram illustrating an example embodiment of a device that may include aggregator circuits and an aggregation processor is shown. In various embodiments, device 900 may implement functionality of delay-line circuit 100 as depicted in FIG. 1. In some embodiments, elements of device 900 may be included within a system on a chip. In some embodiments, device 900 may be included in a mobile device, which may be battery-powered. Therefore, power consumption by device 900 may be an important design consideration. In the illustrated embodiment, device 900 includes fabric 910, compute complex 920, input/output (I/O) bridge 950, cache/memory controller 945, graphics unit 975, and display unit 965. In some embodiments, device 900 may include other components (not shown) in addition to, or in place of, the illustrated components, such as video processor encoders and decoders, image processing or recognition elements, computer vision elements, etc.

Fabric 910 may include various interconnects, buses, MUX's, controllers, etc., and may be configured to facilitate communication between various elements of device 900. In some embodiments, portions of fabric 910 may be configured to implement various different communication protocols. In other embodiments, fabric 910 may implement a single communication protocol, and elements coupled to fabric 910 may convert from the single communication protocol to other communication protocols internally.

In the illustrated embodiment, compute complex 920 includes bus interface unit (BIU) 925, cache 930, and cores 935 and 940. In various embodiments, compute complex 920 may include various numbers of processors, processor cores, and caches. For example, compute complex 920 may include 1, 2, or 4 processor cores, or any other suitable number. In one embodiment, cache 930 is a set associative L2 cache. In some embodiments, cores 935 and 940 may include internal instruction and data caches. In some embodiments, a coherency unit (not shown) in fabric 910, cache 930, or elsewhere in device 900, may be configured to maintain coherency between various caches of device 900. BIU 925 may be configured to manage communication between compute complex 920 and other elements of device 900. Processor cores, such as cores 935 and 940, may be configured to execute instructions of a particular instruction set architecture (ISA) which may include operating system instructions and user application instructions. These instructions may be stored in a computer readable medium such as a memory coupled to cache memory controller 945 as discussed below.

As used herein, the term "coupled to" may indicate one or more connections between elements, and a coupling may include intervening elements. For example, in FIG. 9, graphics unit 975 may be described as "coupled to" a memory through fabric 910 and cache/memory controller 945. In contrast, in the illustrated embodiment of FIG. 9, graphics unit 975 is "directly coupled" to fabric 910 because there are no intervening elements.

Cache/memory controller 945 may be configured to manage transfer of data between fabric 910 and one or more caches and memories. For example, cache/memory controller 945 may be coupled to an L3 cache, which may, in turn, be coupled to a system memory. In other embodiments, cache/memory controller 945 may be directly coupled to a memory. In some embodiments, cache/memory controller 945 may include one or more internal caches. Memory coupled to cache/memory controller 945 may be any type of volatile memory, such as dynamic random access memory (DRAM), synchronous DRAM (SDRAM), double data rate (DDR, DDR2, DDR3, etc.) SDRAM (including mobile versions of SDRAMs such as mDDR3, etc., and/or low power versions of SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to cache/memory controller 945 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 920 to cause the computing device to perform functionality described herein.

Graphics unit 975 may include one or more processors, e.g., one or more graphics processing units (GPUs). Graphics unit 975 may receive graphics-oriented instructions, such as OPENGL®, Metal®, or DIRECT3D® instructions, for example. Graphics unit 975 may execute specialized GPU instructions or perform other operations based on the received graphics-oriented instructions. Graphics unit 975 may generally be configured to process large blocks of data in parallel, and may build images in a frame buffer for output to a display, which may be included in the device or may be a separate device. Graphics unit 975 may include transform, lighting, triangle, and rendering engines in one or more graphics processing pipelines. Graphics unit 975 may output pixel information for display images. Graphics unit 975, in various embodiments, may include programmable shader circuitry which may include highly parallel execution cores configured to execute graphics programs, which may include pixel tasks, vertex tasks, and compute tasks (which may or may not be graphics-related).

Display unit 965 may be configured to read data from a frame buffer and provide a stream of pixel values for display. Display unit 965 may be configured as a display pipeline in some embodiments. Additionally, display unit 965 may be configured to blend multiple frames to produce an output frame. Further, display unit 965 may include one or more interfaces (e.g., MIPI® or embedded display port (eDP)) for coupling to a user display (e.g., a touchscreen or an external display).

I/O bridge 950 may include various elements configured to implement universal serial bus (USB) communications, security, audio, and low-power always-on functionality, for example. I/O bridge 950 may also include interfaces such as pulse-width modulation (PWM), general-purpose input/output (GPIO), serial peripheral interface (SPI), and inter-integrated circuit (I2C), for example. Various types of peripherals and devices may be coupled to device 900 via I/O bridge 850.

In some embodiments, device 900 includes network interface circuitry (not explicitly shown), which may be connected to fabric 810 or I/O bridge 950. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 900 with connectivity to various types of other devices and networks.

Figure 10:
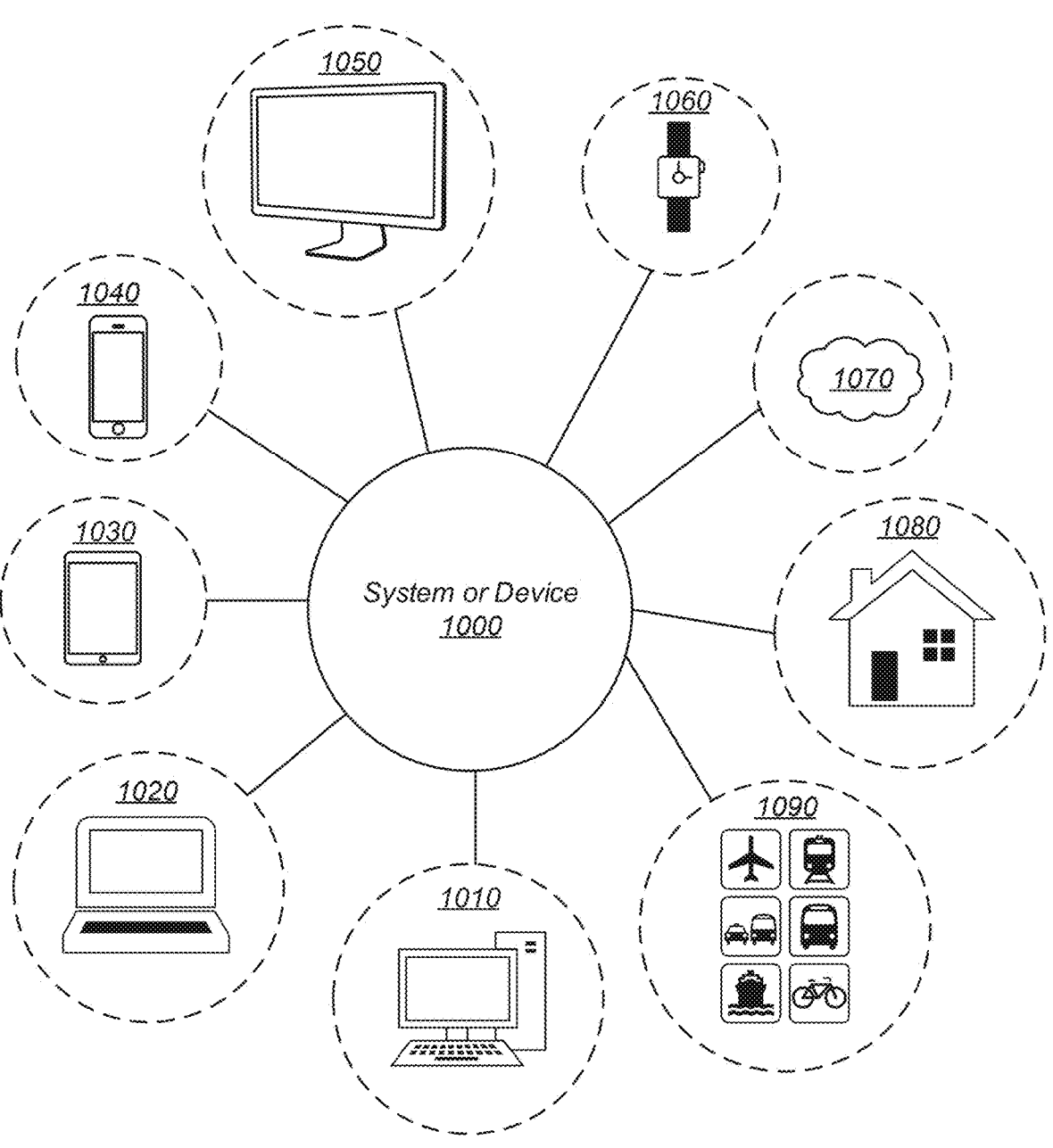
FIG. 10 is a block diagram of various embodiments of computer systems that may include power management circuits.

Turning now to FIG. 10, various types of systems that may include any of the circuits, devices, or systems discussed above are illustrated. System or device 1000, which may incorporate or otherwise utilize one or more of the techniques described herein, may be utilized in a wide range of areas. For example, system or device 1000 may be utilized as part of the hardware of systems such as a desktop computer 1010, laptop computer 1020, tablet computer 1030, cellular or mobile phone 1040, or television 1050 (or set-top box coupled to a television).

Similarly, disclosed elements may be utilized in a wearable device 1060, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1000 may also be used in various other contexts. For example, system or device 1000 may be utilized in the context of a server computer system, such as a dedicated server or on shared hardware that implements a cloud-based service 1070. Still further, system or device 1000 may be implemented in a wide range of specialized everyday devices, including devices 1080 commonly found in the home such as refrigerators, thermostats, security cameras, etc. The interconnection of such devices is often referred to as the "Internet of Things" (IT). Elements may also be implemented in various modes of transportation. For example, system or device 1000 could be employed in the control systems, guidance systems, entertainment systems, etc. of various types of vehicles 1090.

The applications illustrated in FIG. 10 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as design simulation, design synthesis, circuit fabrication, etc.

Figure 11:
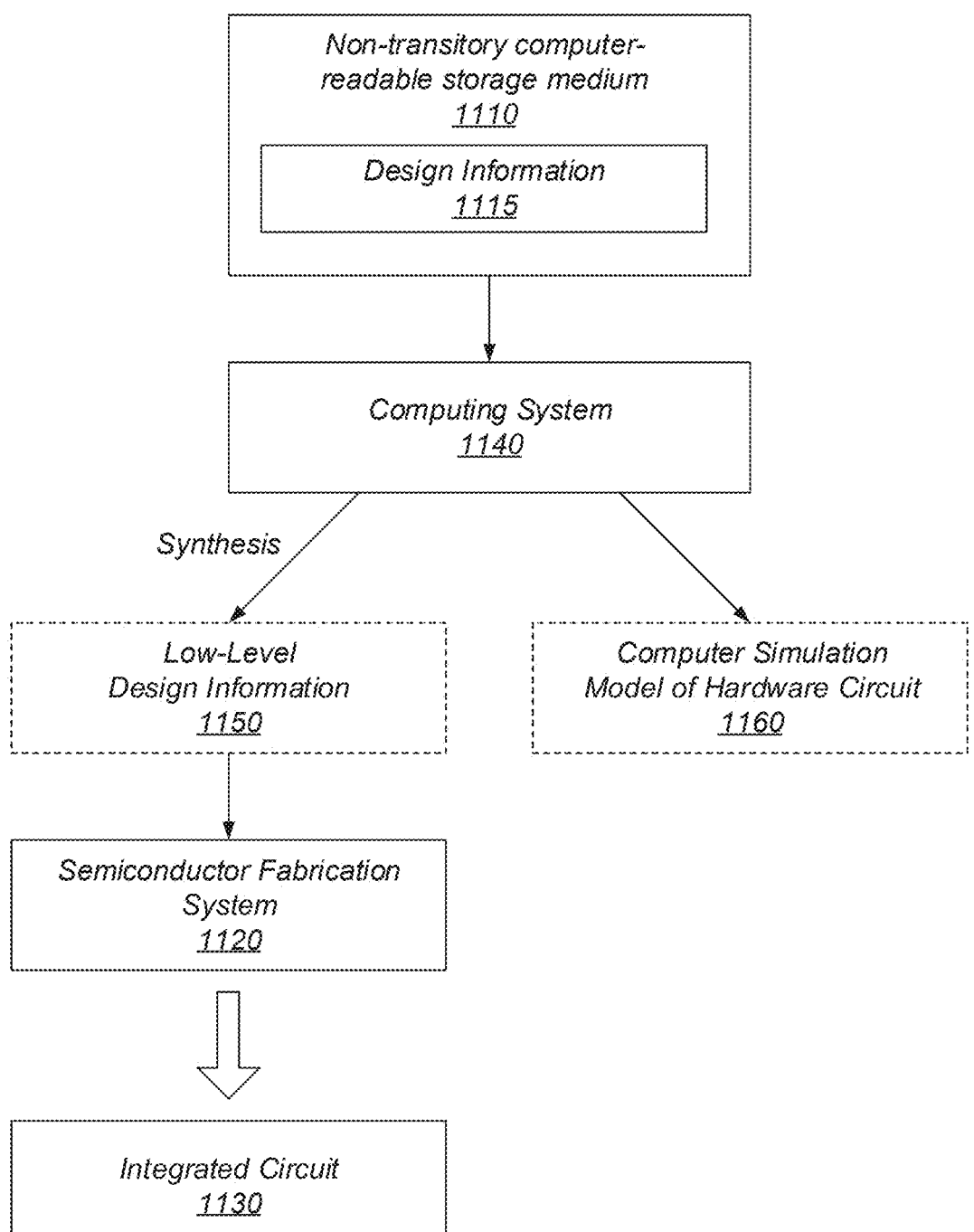
FIG. 11 illustrates an example of a non-transitory computer-readable storage medium that stores circuit design information.

FIG. 11 is a block diagram illustrating an example of a non-transitory computer-readable storage medium that stores design information 1115, according to some embodiments. In the illustrated embodiment, computing system 1140 is configured to process design information 1115. This may include executing instructions included in design information 1115, interpreting instructions included in design information 1115, compiling, transforming, or otherwise updating design information 1115, etc. Therefore, design information 1115 controls computing system 1140 (e.g., by programming computing system 1140) to perform various operations discussed below, in some embodiments.

In the illustrated example, computing system 1140 processes design information 1115 to generate both computer simulation model of hardware circuit 1160 and low-level design information 1150. In other embodiments, computing system 1140 may generate only one of these outputs, may generate other outputs based on design information 1115, or both. Regarding computer simulation model of hardware circuit 1160, computing system 1140 may execute instructions of a hardware description language that includes register transfer level (RTL) code, behavioral code, structural code, or some combination thereof. The simulation model may perform the functionality specified by design information 1115, facilitate verification of the functional correctness of the hardware design, generate power consumption estimates, generate timing estimates, etc.

In the illustrated example, computing system 1140 also processes design information 1115 to generate low-level design information 1150 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on low-level design information 1150 (potentially among other inputs), semiconductor fabrication system 1120 is configured to fabricate integrated circuit 1130 (which may correspond to functionality of the computer simulation model of hardware circuit 1160). Note that computing system 1140 may generate different simulation models based on design information at various levels of description, including low-level design information 1150, design information 1115, and so on. The data representing low-level design information 1150 and computer simulation model of hardware circuit 1160 may be stored on non-transitory computer-readable storage medium 1110, or on one or more other media.

In some embodiments, low-level design information 1150 controls (e.g., programs) semiconductor fabrication system 1120 to fabricate integrated circuit 1130. Thus, when processed by the fabrication system, the design information may program the fabrication system to fabricate a circuit that includes various circuitry disclosed herein.

Non-transitory computer-readable storage medium 1110 may comprise any of various appropriate types of memory devices or storage devices. Non-transitory computer-readable storage medium 1110 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1110 may include other types of non-transitory memory as well, or combinations thereof. Accordingly, non-transitory computer-readable storage medium 1010 may include two or more memory media, which may reside in different locations for example, in different computer systems that are connected over a network.

Design information 1115 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 1140, semiconductor fabrication system 1120, or both. In some embodiments, design information 1115 may also include one or more cell libraries that specify the synthesis, layout, or both of integrated circuit 1130. In some embodiments, design information 1115 is specified in whole, or in part, in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 1130 may, in various embodiments, include one or more custom macrocells, such as memories, analog or mixed-signal circuits, and the like. In such cases, design information 1115 may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 and computer simulation model of hardware circuit 1160 are configured to operate according to a circuit design specified by design information 1115, which may include performing any of the functionality described herein. For example, integrated circuit 1130 may include any of various elements shown in FIGS. 1-7. Further, integrated circuit 1130 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model does not imply that the instructions must be executed in order for the element to be met, but rather, specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by design information 1115. The different circuit implementations may affect the performance, area, power consumption, etc. of a given design (potentially with tradeoffs between different design goals), but the logical function does not vary among the different circuit implementations of the same circuit design.

In some embodiments, the instructions included in design information 1115 provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information included in low-level design information 1150. Low-level design information 1150 may program semiconductor fabrication system 1120 to fabricate integrated circuit 1130.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third," when applied to a feature, do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors, or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, a circuit, or a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), a functional unit, a memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement of such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as a structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits, or portions thereof, may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:
   a fixed delay-line circuit configured, in response to a given transition on an input clock signal, to generate a first corresponding transition on a first output clock signal after a particular delay period has elapsed; and
   a variable delay-line circuit that includes a plurality of fixed-delay circuits and a plurality of variable-delay circuits, wherein the variable delay-line circuit is configured to:
      select, based on a frequency of the input clock signal, a particular subset of the plurality of fixed-delay circuits and the plurality of variable-delay circuits; and
      generate, in response to the particular subset receiving the given transition, a second corresponding transition on a second output clock signal after a different delay period has elapsed.

2. The apparatus of claim 1, wherein to select the particular subset of the plurality of fixed-delay circuits and the plurality of variable-delay circuits, the variable delay-line circuit is further configured, in response to a determination that the input clock signal has a first frequency, to select a first subset of the plurality of fixed-delay circuits and the plurality of variable-delay circuits that includes a first fixed-delay circuit of the plurality of fixed-delay circuits coupled in series with a first variable-delay circuit of the plurality of variable-delay circuits.

3. The apparatus of claim 2, wherein the variable delay-line circuit is further configured, in response to a determination that the input clock signal has a second frequency less than the first frequency, to select a second subset of the plurality of fixed-delay circuits and the plurality of variable-delay circuits that includes the first subset coupled, in series, with a second fixed-delay circuit of the plurality of fixed-delay circuits.

4. The apparatus of claim 3, wherein the variable delay-line circuit is further configured, in response to a determination that the input clock signal has a third frequency less than the second frequency, to select a third subset of the plurality of fixed-delay circuits and the plurality of variable-delay circuits that includes the second subset coupled, in series, with a third fixed-delay circuit of the plurality of fixed-delay circuits and a second variable-delay circuit of the plurality of variable-delay circuits.

5. The apparatus of claim 4, wherein the variable delay-line circuit is further configured, in response to a determination that the input clock signal has a fourth frequency less than the third frequency, to select a fourth subset of the plurality of fixed-delay circuits and the plurality of variable-delay circuits that includes the third subset coupled, in series, with a fourth fixed-delay circuit of the plurality of fixed-delay circuits.

6. The apparatus of claim 1, wherein the plurality of variable-delay circuits includes a given variable-delay circuit configured, in response to a given transition on an input signal, to generate a corresponding transition on an output signal after a particular delay period has elapsed, wherein the particular delay period is based on at least one operating condition of a computer system that includes the variable delay-line circuit.

7. A method, comprising:
generating, by a fixed delay-line circuit in response to a given transition on an input clock signal, a first corresponding transition on a first output clock signal after a particular delay period has elapsed;
selecting, by a variable delay-line circuit based on a frequency of the input clock signal, a particular subset of a plurality of fixed-delay circuits and a plurality of variable-delay circuits, wherein the plurality of fixed-delay circuits and the plurality of variable-delay circuits are included in the variable delay-line circuit; and
generating, by the variable delay-line circuit in response to the particular subset receiving the given transition, a second corresponding transition on a second output clock signal after a different delay period has elapsed.

8. The method of claim 7, wherein selecting the particular subset of the plurality of fixed-delay circuits and the plurality of variable-delay circuits includes, selecting, by the variable delay-line circuit in response to determining that the input clock signal has a first frequency, a first subset of the plurality of fixed-delay circuits and the plurality of variable-delay circuits that includes a first fixed-delay circuit of the plurality of fixed-delay circuits coupled in series with a first variable-delay circuit of the plurality of variable-delay circuits.

9. The method of claim 8, further comprising selecting, in response to determining that the input clock signal has a second frequency less than the first frequency, a second subset of the plurality of fixed-delay circuits and the plurality of variable-delay circuits that includes the first subset coupled, in series, with a second fixed-delay circuit of the plurality of fixed-delay circuits.

10. The method of claim 9, further comprising, selecting, by the variable delay-line circuit in response to determining that the input clock signal has third frequency less than the second frequency, a third subset of the plurality of fixed-delay circuits and the plurality of variable-delay circuits that includes the second subset coupled, in series, with a third fixed-delay circuit of the plurality of fixed-delay circuits and a second variable-delay circuit of the plurality of variable-delay circuits.

11. The method of claim 10, further comprising, selecting, by the variable delay-line circuit in response to determining that the input clock signal has a fourth frequency less than the third frequency, a fourth subset of the plurality of fixed-delay circuits and the plurality of variable-delay circuits that includes the third subset coupled, in series, with a fourth fixed-delay circuit of the plurality of fixed-delay circuits.

12. The method of claim 7, further comprising, generating, by a given variable-delay circuit in response to a given transition on an input signal, a corresponding transition on an output signal after a particular delay period has elapsed, wherein the particular delay period is based on at least one operating condition of a computer system that includes the variable delay-line circuit.

13. An apparatus, comprising:
a first device coupled to a communication bus; and
a second device coupled to the communication bus wherein the second device includes
a fixed delay-line circuit configured, in response to a given transition on an input clock signal, to generate a first corresponding transition on a first output clock signal after a particular delay period has elapsed; and
a variable delay-line circuit that includes a plurality of fixed-delay circuits and a plurality of variable-delay circuits, wherein the variable delay-line circuit is configured to:
select, based on a frequency of the input clock signal, a particular subset of the plurality of fixed-delay circuits and the plurality of variable-delay circuits; and
generate, in response to the particular subset receiving the given transition, a second corresponding transition on a second output clock signal after a different delay period has elapsed.

14. The apparatus of claim 13, wherein to select the particular subset of the plurality of fixed-delay circuits and the plurality of variable-delay circuits, the variable delay-line circuit is further configured, in response to a determination that the input clock signal has a first frequency, to select a first subset of the plurality of fixed-delay circuits and the plurality of variable-delay circuits that includes a first fixed-delay circuit of the plurality of fixed-delay circuits coupled in series with a first variable-delay circuit of the plurality of variable-delay circuits.

15. The apparatus of claim 14, wherein the variable delay-line circuit is further configured, in response to a determination that the input clock signal has a second frequency less than the first frequency, to select a second subset of the plurality of fixed-delay circuits and the plurality of variable-delay circuits that includes the first subset coupled, in series, with a second fixed-delay circuit of the plurality of fixed-delay circuits.

16. The apparatus of claim 15, wherein the variable delay-line circuit is further configured, in response to a determination that the input clock signal has a third frequency less than the second frequency, to select a third subset of the plurality of fixed-delay circuits and the plurality of variable-delay circuits that includes the second subset coupled, in series, with a third fixed-delay circuit of the plurality of fixed-delay circuits and a second variable-delay circuit of the plurality of variable-delay circuits.

17. The apparatus of claim 16, wherein the variable delay-line circuit is further configured, in response to a determination that the input clock signal has a fourth frequency less than the third frequency, to select a fourth subset of the plurality of fixed-delay circuits and the plurality of variable-delay circuits that includes the third subset coupled, in series, with a fourth fixed-delay circuit of the plurality of fixed-delay circuits.

18. The apparatus of claim 17, wherein the plurality of variable-delay circuits includes a given variable-delay circuit configured, in response to a given transition on an input signal, to generate a corresponding transition on an output signal after a particular delay period has elapsed, wherein the particular delay period is based on at least one operating condition of a computer system that includes the variable delay-line circuit.

* * * * *